(12) United States Patent
Mallett

(10) Patent No.: US 9,584,148 B1
(45) Date of Patent: Feb. 28, 2017

(54) SYSTEMS AND METHODS FOR ANALOG TO DIGITAL CONVERTER FAILURE IDENTIFICATION

(71) Applicant: Schweitzer Engineering Laboratories, Inc., Pullman, WA (US)

(72) Inventor: Travis C. Mallett, Pullman, WA (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 0 days.

(21) Appl. No.: 15/000,427

(22) Filed: Jan. 19, 2016

(51) Int. Cl.
*H03M 1/06* (2006.01)
*H03M 1/12* (2006.01)
*H03M 1/34* (2006.01)
*G01R 23/02* (2006.01)
*G01R 31/327* (2006.01)

(52) U.S. Cl.
CPC .......... *H03M 1/1245* (2013.01); *G01R 23/02* (2013.01); *G01R 31/3278* (2013.01); *H03M 1/0631* (2013.01); *H03M 1/34* (2013.01)

(58) Field of Classification Search
CPC ........ H03M 1/00; H03M 1/1071; H03M 1/12; H03M 2201/192
USPC ................................. 341/118, 155
See application file for complete search history.

(56) References Cited

U.S. PATENT DOCUMENTS

| | | | |
|---|---|---|---|
| 4,470,303 A | 9/1984 | O'Donnell | |
| 5,146,202 A * | 9/1992 | Kashihara | B62D 15/02 180/404 |
| 6,515,476 B1 * | 2/2003 | Oshio | G01R 33/243 324/307 |
| 6,972,700 B2 * | 12/2005 | Kanekawa | B60T 8/885 318/563 |
| 7,286,068 B2 | 10/2007 | Stanley | |
| 7,557,572 B1 | 7/2009 | Hertz | |
| 8,330,437 B1 | 12/2012 | Hartman | |
| 2004/0163017 A1 * | 8/2004 | Koga | H03M 1/109 714/48 |

(Continued)

OTHER PUBLICATIONS

Siemens, Siprotec 5: Modular Hardware Design, 03 Hardware Overview SIPROTEC 5/DIGSI 5 Basic Course, Siemens Power Academy TD, Version: D_02_p. 26, Jan. 2012.

(Continued)

*Primary Examiner* — Jean B Jeanglaude
(74) *Attorney, Agent, or Firm* — Stoel Rives, LLP

(57) ABSTRACT

The present disclosure provides systems and methods for identifying and reporting failures of an analog to digital (A/D) conversion system. The systems and methods are configured to detect and report a failure of a preamplifier of the A/D conversion system and/or a failure of a A/D converter of the A/D conversion system. A high frequency component can be included in the input of an A/D converter. The A/D converter is configured to output a digital value to the A/D conversion system, wherein the digital value includes the high frequency component of the A/D converter input. The A/D conversion system is configured to determine an output status, including a frequency component and a corresponding amplitude, and to determine a failure of the A/D conversion system based on the determined output status. The A/D conversion system can report a change in, or a failure of, the A/D converter, and can operate or prevent operation of protection elements.

20 Claims, 7 Drawing Sheets

(56) References Cited

U.S. PATENT DOCUMENTS

2013/0297575 A1\* 11/2013 Fallon .............. G06F 17/30312
707/693

OTHER PUBLICATIONS

Etzel, M.; Jenkins, W., "Redundant residue number systems for error detection and correction in digital filters," Acoustics, Speech and Signal Processing, IEEE Transactions on , vol. 28, No. 5, pp. 538,545, Oct. 1980. URL: http://ieeexplore.ieee.org/stamp/stamp.jsp?tp=&arnumber=1163442&isnumber=26148.

Singh, M.; Koren, I., "Fault-sensitivity analysis and reliability enhancement of analog-to-digital converters," Very Large Scale Integration (VLSI) Systems, IEEE Transactions on , vol. 11, No. 5, pp. 839,852, Oct. 2003. URL: http://ieeexplore.ieee.org/stamp/stamp.jsp?tp=&arnumber=1234403&isnumber=27663.

Willsky, Alan S. "A survey of design methods for failure detection in dynamic systems." Automatica 12.6 (1976): 601-611. URL: http://www.sciencedirect.com/science/article/pii/0005109876900418.

\* cited by examiner

SYSTEMS AND METHODS FOR ANALOG TO DIGITAL CONVERTER FAILURE IDENTIFICATION

TECHNICAL FIELD

This disclosure relates to validation and measurement systems and methods in electric power delivery systems. More particularly, this disclosure relates to analog to digital converter failure identification.

BRIEF DESCRIPTION OF THE DRAWINGS

Non-limiting and non-exhaustive embodiments of the disclosure are described herein, including various embodiments of the disclosure with reference to the figures listed below.

Figure 1:
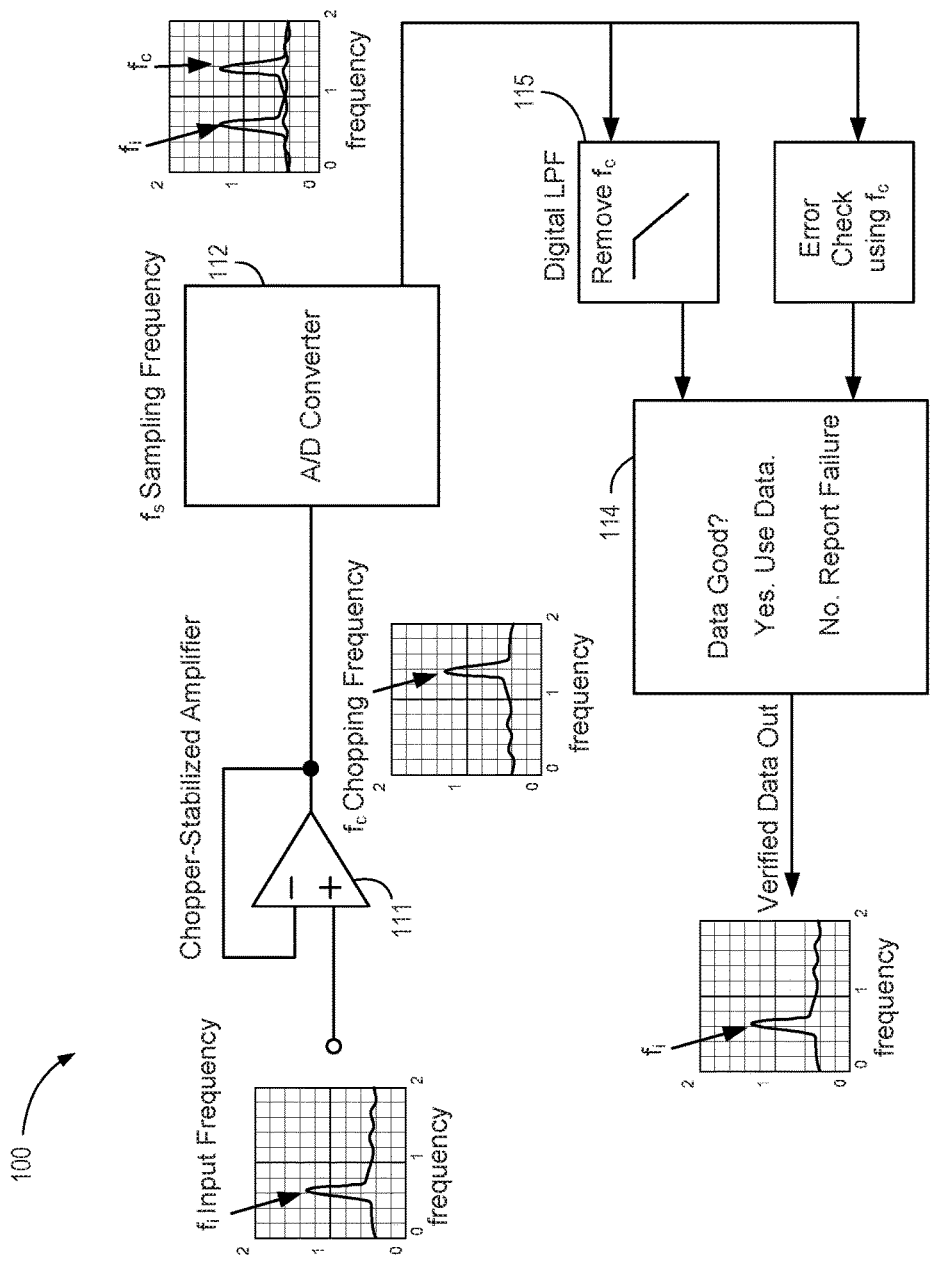
FIG. 1 illustrates a system for detecting a failure of an analog to digital converter, according to one embodiment.

In the following description, numerous specific details are provided for a thorough understanding of the various embodiments disclosed herein. The systems and methods disclosed herein can be practiced without one or more of the specific details, or with other methods, components, materials, etc. In addition, in some cases, well-known structures, materials, or operations may not be shown or described in detail in order to avoid obscuring aspects of the disclosure. Furthermore, the described features, structures, or characteristics may be combined in any suitable manner in one or more alternative embodiments.

DETAILED DESCRIPTION

Protection relays may be installed in electric power generation, transmission, and distribution facilities to detect overloads, short circuits, and other fault conditions. For example, large amounts of current may flow through a power line into a ground or other shorting medium in response to one or more short circuit faults. A protective relay may be configured to detect a fault condition (e.g. a short circuit fault) based on an overcurrent element associated with a specific amount of current and may trip a breaker, clearing the fault. In some embodiments, protective relays may be deemed "mission critical" equipment for the integrity of the power system and personal safety of the users and operators. In many embodiments and configurations of a protective relay, the reliability and proper function of a protective relay may be of utmost concern.

Many embodiments of a protective relay are electronic devices employing FPGAs, microcontrollers, CPUs, analog to digital (A/D) converters, electronic displays, communication ports, and other electronic devices and systems to digitize power system currents and/or voltages and/or process data associated with the digitized currents and voltages according to various algorithms and/or digital filters. A protective relay may be configured to make protection decisions based on data associated with a digitized power system currents and/or voltages, and may communicate decisions made by a protective relay to an appropriate system or personnel, and/or may otherwise cause a suitable response to the digitized power system currents and/or voltages.

While the reliability of many essential electronic devices and systems in a protective relay have been thoroughly investigated, decisions made by a protective relay may only be as reliable as any digitized current and/or voltage data communicated to the protective relay from an A/D converter. If an A/D converter communicates false or inaccurate information to a protective relay without any indication of one or more errors associated with the communicated information, the protective relay may act based on the received false or inaccurate data, and may cause unintended consequences known as an "unintended operation" (UO).

One or more embodiments disclosed herein may be configured to communicate with, control, operate, energize, de-energize, and/or disengage one or more power system protection elements, such as a protection relay. Protection relays may be installed in electric power transmission and distribution facilities to detect overloads, short circuits, and other fault conditions.

This disclosure includes methods and systems to enable an A/D conversion system to detect, measure, report, and/or communicate: an A/D converter failure, a failure in the analog signal conditioning and amplification, and/or a failure in digital communication upstream of the A/D converter.

For example, an A/D conversion system with failure identification may include an amplifier to receive an input and produce an amplified output injected with at least one identifiable characteristic. The amplifier may be a chopper amplifier and/or chopper stabilized. The identifiable characteristic may be a chopping frequency of the chopper amplifier. The identifiable characteristic may be a single, injected frequency tone.

The A/D converter may receive the amplified output and convert the output to a digital output. A failure identification module may determine the existence or non-existence of the identifiable characteristic in the digital output. In some embodiments a frequency domain analysis of a fast Fourier transform of the output of the A/D converter may be used. A filter may filter the digital output to remove the identifiable characteristic from the digital output. Additionally, an alert module may provide a failure notification based on a determination by the failure identification module that the identifiable characteristic does not exist in the digital output or has changed behavior in a manner indicative of an A/D and/or amplifier failure.

The analysis, failure determination, verification, and/or the like may be determined by an intelligent electronic device (IED). The IED may include a meter to identify a frequency characteristic injected by an amplifier into an input of an A/D converter. The input to the amplifier may include a frequency range $f_a$, and the output of the amplifier may include a signal, $f_a + f_c$, where $f_c$ is the injected frequency characteristic. The frequency characteristic may correspond to a chopping frequency of a chopper-stabilized amplifier (e.g., a chopper amplifier). The meter may take actual measurements, retrieve data from storage, and/or receive data from an external measurement device. For example, the meter may measure the chopping frequency of a chopper amplifier by comparing an input and an output of the chopper amplifier.

The meter may be further used to obtain a measurement of an output of the A/D converter. A frequency characteristic module may determine that the frequency characteristic, $f_c$, is missing from the output of the A/D converter and an error reporting module may then report a failure of the A/D converter and/or amplifier based on the determination that the frequency characteristic, $f_c$, is missing from the output of the A/D converter or has changed behavior in a manner indicative of an A/D and/or amplifier failure. The frequency characteristic module may determine that the frequency characteristic is missing or otherwise different from expected based on a frequency domain analysis of a fast Fourier transform of the output of the A/D converter. For example, the frequency characteristic may be modified relative to an expectation beyond a threshold level of acceptability.

Any of a wide variety of systems and methods may be adapted to perform the systems and methods described herein. In various embodiments, an IED or other device may verify a digital output of an A/D converter and/or provide an alert when the A/D converter experiences or appears to be experiencing an error. An amplifier as used throughout may include any combination of a wide variety of amplifiers and associated components. An amplifier may have a gain of less than unity, unity, or more than unity and may be variable based on control inputs. The injected or identifiable signals and characteristics described herein may be directly and intentionally injected or alternatively may simply correspond to the inherent characteristics of components connected upstream of the A/D converter.

Some embodiments of an A/D conversion system may include one or more IEDs, which may be used for monitoring, protecting, and/or controlling industrial and utility equipment, such as in electric power delivery systems. IEDs within an A/D conversion system may be configured to perform metering, control, and protection functions that require a certain level of accuracy. Further, IEDs may be configured to obtain measurement information from A/D converters, and may be configured to identify any potential failures of an A/D converter from which the IED is receiving data. Specifically, the health of an A/D converter may be monitored and/or validated on a regular basis (e.g., at predetermined time periods or in response to a specific event) by determining the existence and/or behavior of a known characteristic of a signal injected by an external amplifier to ensure that it is functioning correctly and/or that any failure of the A/D converter is identified and/or reported. Errors and/or abnormalities can then be identified and reported.

The IED may utilize a common time source, such as a time signal provided by a global positioning system (GPS) or via a time-syncing standard such as IEEE 1588 to time-align the collected measurement data. Accordingly, the IED may be time-aligned to allow for synchrophasors to be calculated. Additionally, the IED may utilize identical or similar sampling and processing algorithms for the collected measurement data of several A/D converters to further facilitate the calculations of accurate synchrophasors.

However, in many situations, the IED may utilize unsynchronized time signals and/or alternative sampling and processing algorithms for the collected data of one or more A/D converters. For example, a system may include any number of A/D converters that are different models and/or utilize independent time signals. In such embodiments, the data collected may not be inherently time-aligned. If different model A/D converters are used and/or the converters are not time-aligned, then an event trigger common to both A/D converters may be used to align the measurement data from each converter. For example, each A/D converter may be configured to begin collecting data when a power system event or anomaly is detected, such as when an overcurrent is detected.

An A/D conversion system may include a single IED to monitor a particular A/D converter. In other embodiments, the input of the single IED may be time-synchronized with some synchronous signal as described above. In still other embodiments of an A/D conversion system, two or more IEDs may be configured to monitor the same A/D converter. The collected measurement data of the two or more IEDs may be synchronized using any of a wide variety of methods and approaches, including those previously described.

With the measurement data from each A/D converter time-aligned, the IED may determine via a meter, a plurality of output voltages for each A/D converter at times corresponding to common event triggers. The plurality output voltages for the measurement data collected by the IED should be approximately the same, since they are aligned with respect to one another using the common event triggers, and/or are collected from two or more A/D converters in a parallel electronic configuration. The collected measurement data corresponding to the output voltages of a first and second A/D converters may be identical and/or significantly similar in magnitude.

At a first time, the frequency characteristic module or a frequency characteristic device may determine a first magnitude for a first center frequency corresponding to a frequency characteristic associated with at least one of an amplifier, an A/D converter, and/or the output of an A/D converter. The determined first magnitude for the first center frequency may correspond to any suitable value according to the configuration of the amplifier. The determined first magnitude for the first frequency may correspond to a frequency characteristic that is a single frequency tone, configured to be indicative of an inherent feature of the amplifier. In some embodiments, the amplifier may be configured as a chopper amplifier, and the determined first center frequency may be based on an operational frequency, a switching frequency, and/or a chopping frequency of the amplifier.

At a second time, the frequency characteristic module may determine a second magnitude for a second center frequency corresponding to the frequency characteristic of the amplifiers of each A/D converter. The frequency characteristic module may determine the second magnitude based on a measured, determined, and/or calculated magnitude at the second center frequency which may substantially approximate the first center frequency. In certain embodiments, the frequency characteristic module may determine the second magnitude for the second center frequency based on a frequency domain analysis of one or more pluralities of consecutive voltages of each of the A/D converters.

The A/D conversion system may compare the second magnitude of a single frequency tone of one A/D converter with that of another A/D converter (e.g., first A/D converter with second A/D converter or vice versa). The comparison of two or more second and/or expected magnitudes at a second center frequency of a frequency characteristic may be performed according to any suitable method.

For example, one second magnitude may be subtracted from another second magnitude of another A/D converter. In some embodiments, a second magnitude may be compared with a digital value and/or with an expected magnitude of an A/D converter (e.g., with the expected magnitude determined by the frequency tone determination module). A second magnitude of a single frequency tone may be configured to approximate a magnitude of one or more components of the plurality of output voltages.

One or more pluralities of consecutively measured voltages of the system (e.g., output of the amplifier and output of the A/D converter) may be compared or otherwise analyzed to determine a second magnitude or other suitable quantity indicative of a characteristic of an amplifier associated with an A/D converter. For example, the second magnitude of a frequency characteristic may be determined according to a fast Fourier transform of a plurality of consecutive output voltage values.

A comparator module or device may compare the second magnitude and the expected magnitude of the single frequency tones of the first and second A/D converters. The comparator module may identify a failure of the first and/or second A/D converters, if the determined second magnitude from the first and/or second A/D converters exceeds one or more expected magnitudes of the single frequency tones. The determined second magnitude may be less than the expected magnitude of either the first or second A/D converter. The comparator module and/or device may be configured to identify a non-failure, or may indicate that no failure of either A/D converter has been identified.

A first IED and a second IED may function as primary and backup IEDs, respectively. The first IED and the second IED may function as dual-primary IEDs. Any number of IEDs may be used in conjunction with the validation systems and methods described herein. For example, three or four IEDs may be utilized to validate one another in a primary-backup combination or as a plurality of primary IEDs.

The systems and methods described herein may be expanded for use in an enterprise and/or industrial environment in which a validation module or validation device may be in communication with any number (i.e., hundreds or even thousands) of pairs of IEDs functioning in dual-primary or primary-backup configurations. Accordingly, a centralized validation system may be capable of remotely validating the functionality of measurement devices and/or IEDs throughout an electric power delivery system. Similarly, a validation module or validation device may be adapted to monitor and regularly validate the functionality of measurement devices and/or IEDs within a substation of an electric power delivery system.

The phrases "connected to" and "in communication with" refer to any form of interaction between two or more components, including mechanical, electrical, magnetic, and electromagnetic interaction. Two components may be connected to each other, even though they are not in direct contact with each other, and even though there may be intermediary devices between the two components.

As used herein, the term "IED" may refer to any microprocessor-based device that monitors, controls, automates, and/or protects monitored equipment within a system. Such devices may include, for example, remote terminal units, differential relays, distance relays, directional relays, feeder relays, overcurrent relays, voltage regulator controls, voltage relays, breaker failure relays, generator relays, motor relays, automation controllers, bay controllers, meters, recloser controls, communications processors, computing platforms, programmable logic controllers (PLCs), programmable automation controllers, input and output modules, motor drives, and the like. IEDs may be connected to a network, and communication on the network may be facilitated by networking devices including, but not limited to, multiplexers, routers, hubs, gateways, firewalls, and switches. Furthermore, networking and communication devices may be incorporated in an IED or be in communication with an IED. The term "IED" may be used interchangeably to describe an individual IED or a system comprising multiple IEDs.

Some of the infrastructure that can be used with embodiments disclosed herein is already available, such as: general-purpose computers, computer programming tools and techniques, digital storage media, and communications networks. A computer may include a processor, such as a microprocessor, microcontroller, logic circuitry, or the like. The processor may include a special purpose processing device, such as an ASIC, PAL, PLA, PLD, Field Programmable Gate Array, or other customized or programmable device. The computer may also include a computer-readable storage device, such as non-volatile memory, static RAM, dynamic RAM, ROM, CD-ROM, disk, tape, magnetic, optical, flash memory, or other computer-readable storage medium.

Suitable networks for configuration and/or use, as described herein, include any of a wide variety of network infrastructures. Specifically, a network may incorporate landlines, wireless communication, optical connections, various modulators, demodulators, small form-factor pluggable (SFP) transceivers, routers, hubs, switches, and/or other networking equipment.

The network may include communications or networking software, such as software available from Novell, Microsoft, Artisoft, and other vendors, and may operate using TCP/IP, SPX, IPX, SONET, and other protocols over twisted pair, coaxial, or optical fiber cables, telephone lines, satellites, microwave relays, modulated AC power lines, physical media transfer, wireless radio links, and/or other data transmission "wires." The network may encompass smaller networks and/or be connectable to other networks through a gateway or similar mechanism.

Aspects of certain embodiments described herein may be implemented as software modules or components. As used herein, a software module or component may include any type of computer instruction or computer executable code located within or on a computer-readable storage medium. A software module may, for instance, comprise one or more physical or logical blocks of computer instructions, which may be organized as a routine, program, object, component, data structure, etc. that perform one or more tasks or implement particular abstract data types.

A particular software module may comprise disparate instructions stored in different locations of a computer-readable storage medium, which together implement the described functionality of the module. Indeed, a module may comprise a single instruction or many instructions, and may be distributed over several different code segments, among different programs, and across several computer-readable storage media. Some embodiments may be practiced in a distributed computing environment where tasks are performed by a remote processing device linked through a communications network. In a distributed computing environment, software modules may be located in local and/or remote computer-readable storage media. In addition, data being tied or rendered together in a database record may be resident in the same computer-readable storage medium, or across several computer-readable storage media, and may be linked together in fields of a record in a database across a network.

The embodiments of the disclosure can be understood by reference to the drawings, wherein like parts are designated by like numerals throughout. The components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments. In other instances, well-known structures, materials, or operations are not shown or described in detail to avoid obscuring aspects of this disclosure. In addition, the steps of a method do not necessarily need to be executed in any specific order, or even sequentially, nor need the steps be executed only once, unless otherwise specified.

FIG. 1 illustrates a system 100 for detecting a failure of an A/D converter 112 or analog front-end such as an amplifier or amplifier module 111, according to one embodiment of the present disclosure. The system 100 may include an amplifier or amplifier module 111, the A/D converter 112, and an IED 114 configured with a variety of modules to implement one or more functions and/or operations. The system 100 may be configured to measure one or more pluralities of consecutive voltages to detect a failure of the A/D converter 112 and/or a failure of the amplifier module 111, and to operate one or more components of a power system based on the detected failure.

An input of the amplifier 111 may be electrical communication with one or more power system components of interest to allow the A/D converter 112 to measure and/or monitor a voltage associated with the components of interest. An output of the amplifier 111 may be electrically connected to the input of the A/D converter 112. The amplifier 111 may include a chopping frequency, a modulation frequency, a frequency of operation, and/or an operating frequency based on the configuration of the amplifier 111. In certain embodiments, the amplifier 111 may be configured to operate as a chopper amplifier and/or a chopper-stabilized amplifier.

The output of the amplifier 111 may include a frequency characteristic corresponding to the configuration of the amplifier 111. The frequency characteristic may be introduced, injected, and/or caused by the amplifier 111 according to one or more characteristics of the amplifier 111. In some embodiments, the frequency characteristic is not present in the input of the amplifier 111, and is present in the output of the amplifier 111.

The system 100 may compute and/or determine a first magnitude for a first center frequency corresponding to the frequency characteristic associated with the amplifier 111 at a first time. The first magnitude for the first center frequency may be determined by the system 100 based on any number of suitable characteristics of the amplifier 111. For example, the IED 114 of the system 100 may determine the first magnitude based on a gain of the amplifier 111 and for the first center frequency based on a modulation and/or operational frequency of the amplifier 111.

The system 100 may determine a second magnitude for a second center frequency corresponding to the frequency characteristic associated with the amplifier 111 at a second time. In certain embodiments, the system 100 may determine the second magnitude for a second center frequency in a manner substantially similar to how the first magnitude for the first center frequency was determined.

In certain embodiments, the frequency characteristic of the amplifier output may be a single frequency tone. The single frequency tone may include a center frequency and a non-zero magnitude with a distribution or waveform shape that may be known based on the center frequency of the single frequency tone. The IED 114 may measure and/or determine the magnitude and the center frequency corresponding to the single frequency tone. As described above, the center frequency of the single frequency tone may correspond to an operating frequency of the amplifier 111.

The modulation frequency of the amplifier module 111 may be configured to be several times larger than the frequency of the signal of interest. For example, the frequency of the signal of interest may be less than 200 Hertz and the modulation frequency of the amplifier module 111 may be greater than 5,000 Hertz.

The A/D converter 112 may receive the output of the amplifier module 111 and may output corresponding output voltages and/or voltage measurements to an IED 114. The IED 114 may duplicate the received output voltages, and/or may perform several functions and/or operations on each of the output voltages.

The IED 114 may be configured to implement a digital low-pass filter function 115, a comparator function, and/or an error communication function. The IED 114 may receive both a first and a second plurality of consecutive voltages from a meter. The IED 114 may perform the low-pass filter function 115 on one copy of the received plurality of consecutive voltages, and may perform a fast Fourier transform operation on another unfiltered copy of the received plurality of consecutive voltages. The IED 114 may determine the first magnitude of a single frequency tone based on an analysis of the unfiltered plurality of consecutive voltages in the frequency domain (e.g., following the fast Fourier transform of the data).

For example, the IED 114 may determine the first and second magnitudes based on an average magnitude value within a specified frequency range or bandwidth that is symmetric about the first and/or second center frequencies.

The IED 114 may determine the first magnitude for a first center frequency corresponding to the single frequency tone of the output voltages. The IED 114 may compare the determined first and the second magnitudes of the single frequency tone. Based on the comparison made by the IED 114, if the determined second magnitude of the single frequency tone is less than the determined first magnitude, the IED 114 may report an error of the A/D converter 112 and/or amplifier module 111 via a communication module and/or a communication link.

Figure 2:
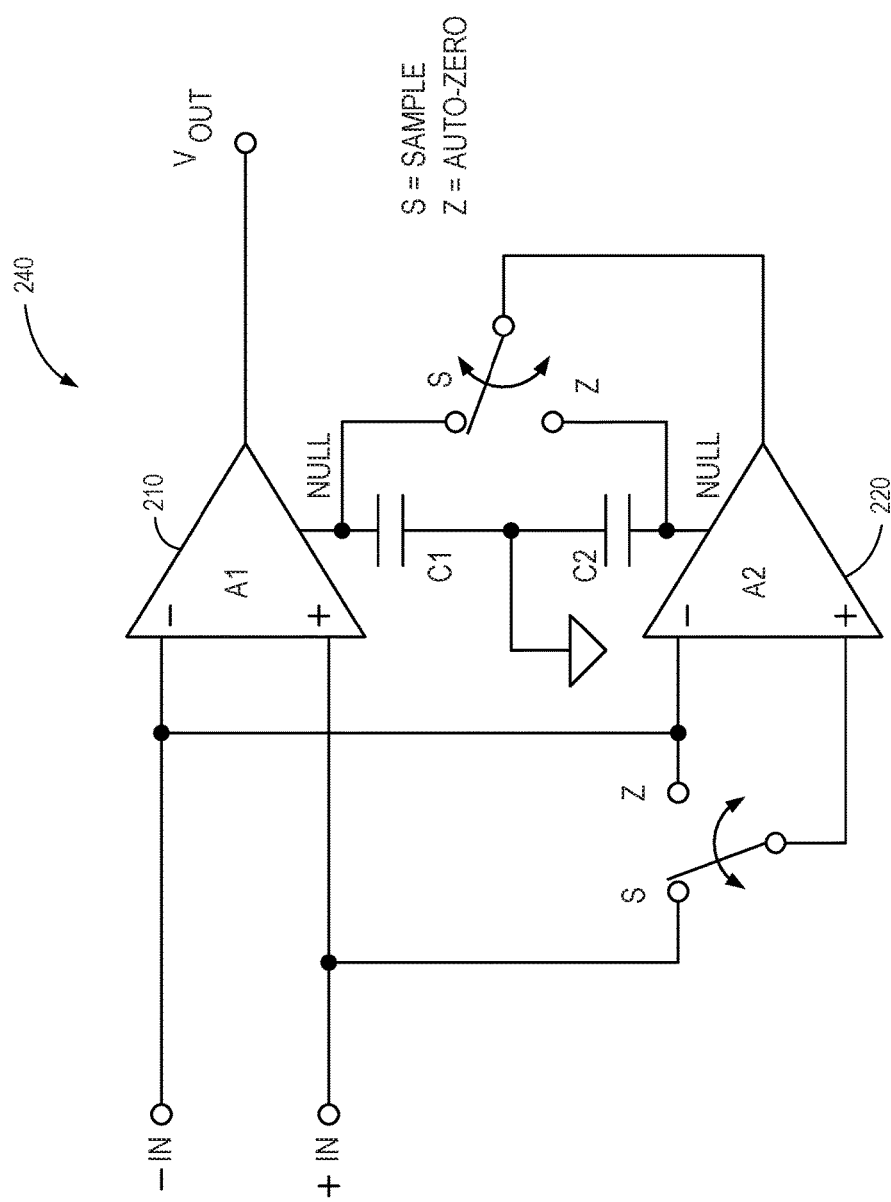
FIG. 2 illustrates an amplifier of a system for detecting a failure of an analog to digital converter, according to another embodiment.

FIG. 2 illustrates an amplifier 240 of a system for detecting a failure of an A/D converter, according to another embodiment of the present disclosure. The amplifier 240 of FIG. 2 may be configured to operate as a chopper amplifier or a chopper-stabilized amplifier. The chopper amplifier 240 may include an input that is electrically connected in series with the output of a filter of the A/D conversion system. Alternatively, the amplifier 240 may be configured to be part of an active filter circuit. An output of the chopper amplifier may be electrically connected in series with an input of an A/D converter, according to one embodiment.

The chopper amplifier 240 may include a first operational amplifier 210 with a null terminal electrically connected to a first switch. The first switch may switch between a null terminal of a second operational amplifier 220 and an output of the second operation amplifier 220. The negative input terminals of the first and second operational amplifiers 210, 220 may be electrically connected.

The positive input terminal of the first operational amplifier 210 may be connected to the output of the filter and electrically connected to a second switch. The second switch may alternate electrical connection between the positive input terminal and the negative input terminal of the second operational amplifier 220.

The first and second switches may both operate at a specific modulation frequency and/or chopping frequency. That is, the first switch and the second switch may alternate electrical connection between the two connections described for each switch, at a predetermined rate.

The first operational amplifier 210 and the second operational amplifier 220 may individually or collectively be arranged and/or configured according to any suitable arrangement, which may be based on a specific configuration of the A/D conversion system. A suitable configuration of the amplifier 240 may include a combination of one or more of the suitable filter qualities and/or configurations described herein.

Figure 3:
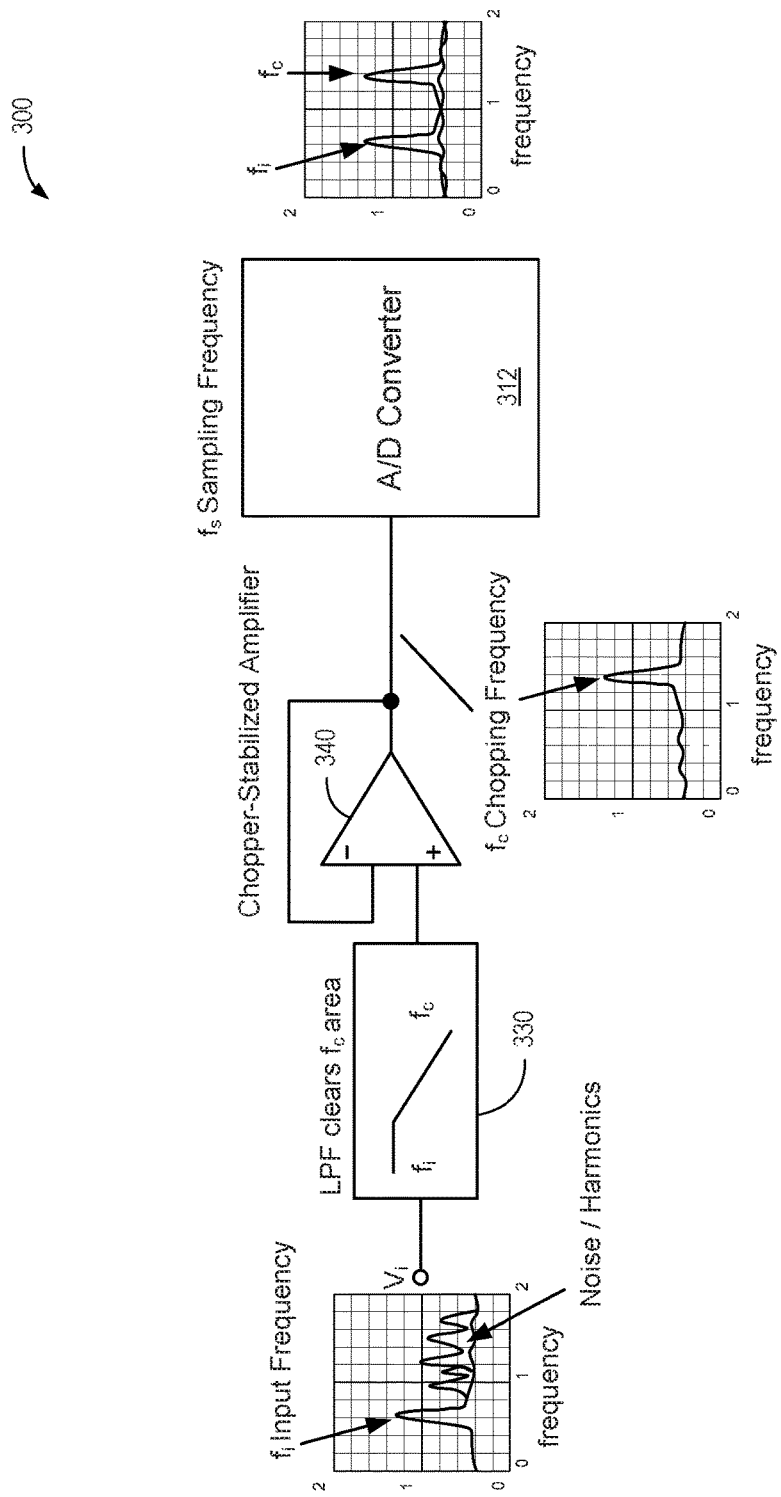
FIG. 3 illustrates a system for detecting a failure of an analog to digital converter according to another embodiment.

FIG. 3 illustrates a system 300 for detecting a failure of an A/D converter according to another embodiment of the present disclosure. The system 300 includes a filter 330 electrically connected in series with an input of an amplifier 340, according to one embodiment. The filter 330 in series with the input of an amplifier 340 of the A/D converter 312 may be an analog filter 330. The filter 330 may function as an anti-aliasing filter and/or a low-pass filter on the input of the amplifier 340. The output of the amplifier 340 may include one or more new frequency domain characteristics (e.g., a single frequency tone) that may be represented in one or more output voltages of the A/D converter 312.

One or more filters may be associated with the A/D converter 312 (e.g., as digital functions implemented by an IED) and may be configured to remove quantization errors present in the digital data stream output by a modulator of the A/D converter 312. The filter 330 may further be configured to remove other kinds of noise from the digital data stream output by a modulator, or to function as an anti-aliasing filter on the input of the A/D converter 312. A modulator of an A/D converter 312 may incorporate quantization error, quantization noise, and other common kinds of noise into the output digital data stream. The noise and/or errors present in the digital data stream output by a modulator may exist at frequencies centered around a sampling frequency of the A/D converter 312. However, the frequency of the information of interest present in the digital data stream may be centered at a smaller frequency than the sampling frequency of the A/D converter 312. More than one filter may be associated with the A/D converter 312 to facilitate removal and/or attenuation of one or more noise elements without removing or attenuating a portion of the digital data stream containing some or all of the information of interest.

The filter 330 associated with the A/D conversion system 300 may be implemented as either a digital function or as analog circuitry. A filter may be an analog low-pass filter according to a Sallen-Key filter topology, or may be a low-pass filter implemented as a digital function (e.g., by an IED). However, a filter associated with the A/D conversion system 300 (e.g., a filter electrically connected in series to the input of an amplifier module) may be any suitable filter, and may be configured according to any suitable filter configuration.

The filter(s) associated with the A/D conversion system 300 may have any suitable step or impulse response. Many different types of filter topologies may be associated with the A/D conversion system 300. For example, the filter may be a sinc filter, a high-pass filter, a low-pass filter, a sinc in time filter, a sinc in frequency filter, a band pass filter, a notch filter, a comb filter, or any other suitable kind of filter. For example, the features of a filter may facilitate detection of one or more failures of an A/D converter.

Figure 4:
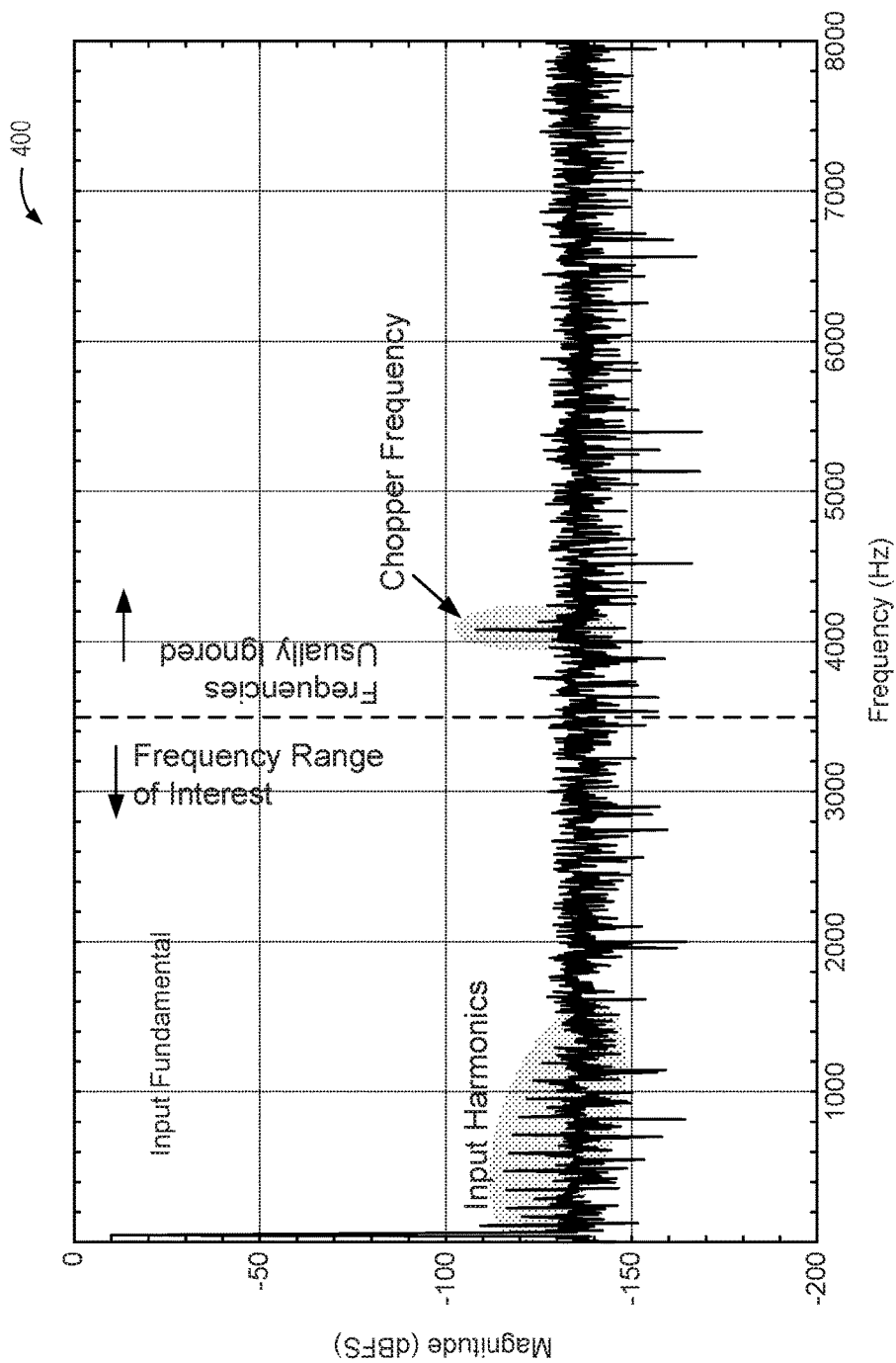
FIG. 4 illustrates a graph of an output of an analog to digital converter in the frequency domain, according to one embodiment.

FIG. 4 illustrates a graph 400 of an output of an A/D converter in the frequency domain, with the frequency increasing along the horizontal axis and the magnitude shown on the vertical axis, according to one embodiment of the present disclosure. The graph 400 highlights the frequency and magnitude of a single frequency tone, and shows the large frequency difference of a frequency of the signal of interest and the single frequency tone.

Figure 5:
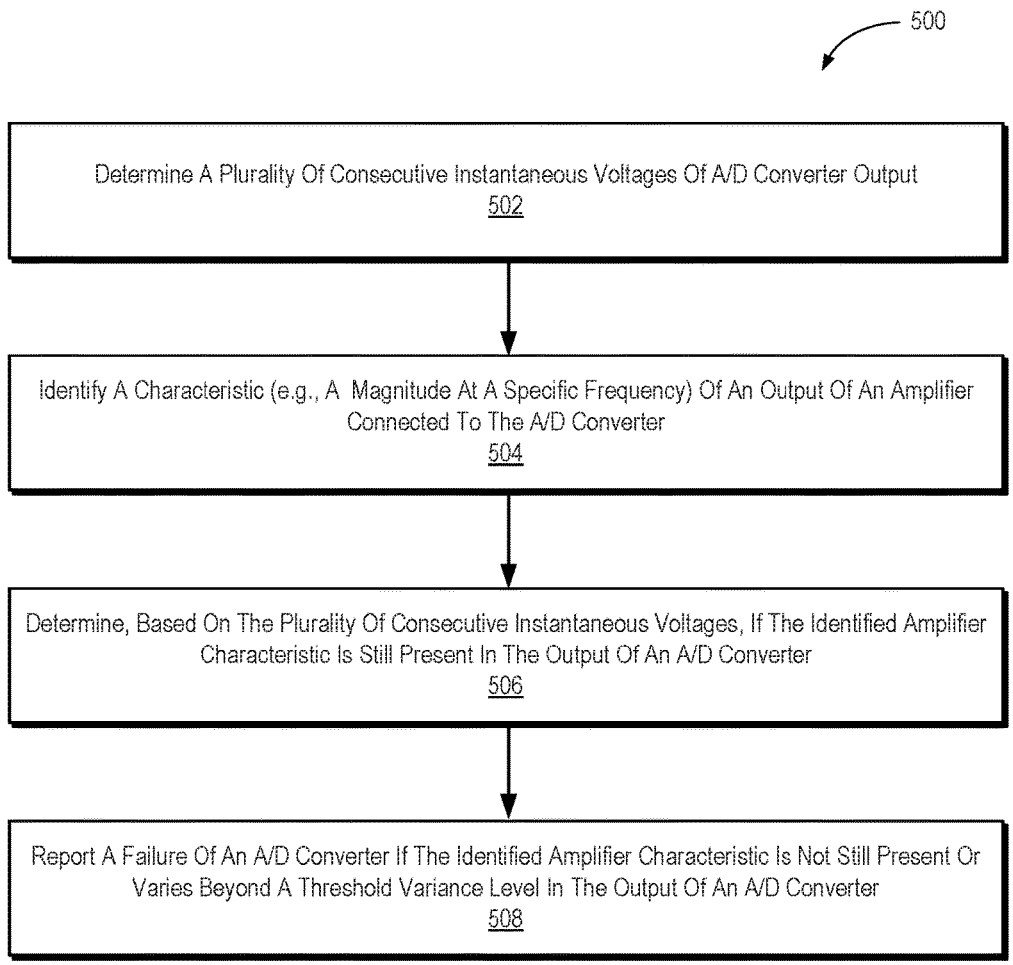
FIG. 5 is a flowchart of a method for detecting a failure of an analog to digital converter, according to one embodiment.

FIG. 5 is a flowchart of a method for detecting a failure of an A/D converter, according to one embodiment of the present disclosure. A method 500 for detecting a failure of an A/D converter, according to one embodiment, may be implemented on a computing device. The method may include determining a plurality of consecutive instantaneous voltages 502 of A/D converter output. A computing device may be configured to determine the plurality of consecutive voltages using a voltage meter or any other suitable measurement device. The determined plurality of consecutive voltages may be analog voltages and/or may be represented by digital quantities. A computing device may be configured to store all relevant information of the determined voltages as a digital quantity associated with the determined voltages. The determined plurality of consecutive voltages may include the time at which each voltage was determined, and may include an amplitude of each determined voltage.

The amplitude of the first voltage may be any value within a range of expected or possible voltage amplitude values. For example, for a given transmission system the amplitude of the first determined voltage may be expected to be between approximately negative 33 KV and positive 33 KV.

An output of the A/D converter may be in electrical communication with a computing device. The A/D converter output may be configured to couple with a computing device through one or more suitable indirect means of electrical coupling. The determined plurality of consecutive instantaneous voltages may be output voltage values of one or more A/D converter outputs.

The method may also include identifying 504 a characteristic (e.g., a magnitude at a specific frequency) associated with an output of an amplifier connected to the input of the A/D converter, as described and defined herein. A computing device may be configured to determine, based on the plurality of consecutive instantaneous voltages, if the identified amplifier characteristic is still present in the output of an A/D converter, at 506. This may be determined based on an analysis of the amplitudes of a second plurality of instantaneous voltages. For example, the analysis may be performed using a fast Fourier transform operation on the plurality of consecutive voltages.

If the identified amplifier characteristic varies significantly, has been modified beyond a threshold level of acceptance, and/or is no longer present, then the method may include, at 508, reporting a failure of an A/D converter. The computing device and/or IED may be configured to identify a failure of the A/D converter and may report the failure according to any suitable method.

For example, a computing device may be configured to report the failure of the A/D converter to a communication system coupled with the computing device. The computing device may be configured to illuminate one or more warning lights, and may indicate a failure of an A/D converter to a user with the one or more illuminated warning lights. In other embodiments, the computing device may be configured to terminate one or more processes and/or disable one or more components of a power system coupled with the computing device. However, the computing device may be configured to operate according to any suitable manner in response to one or more identified failures of an A/D converter. The computing device may be configured to communicate a status of one or more A/D converters to a communication system coupled with the computing device. The computing device may include one or more status lights to indicate when no failures have been detected in one or more A/D converters configured to couple with the computing device.

Figure 6:
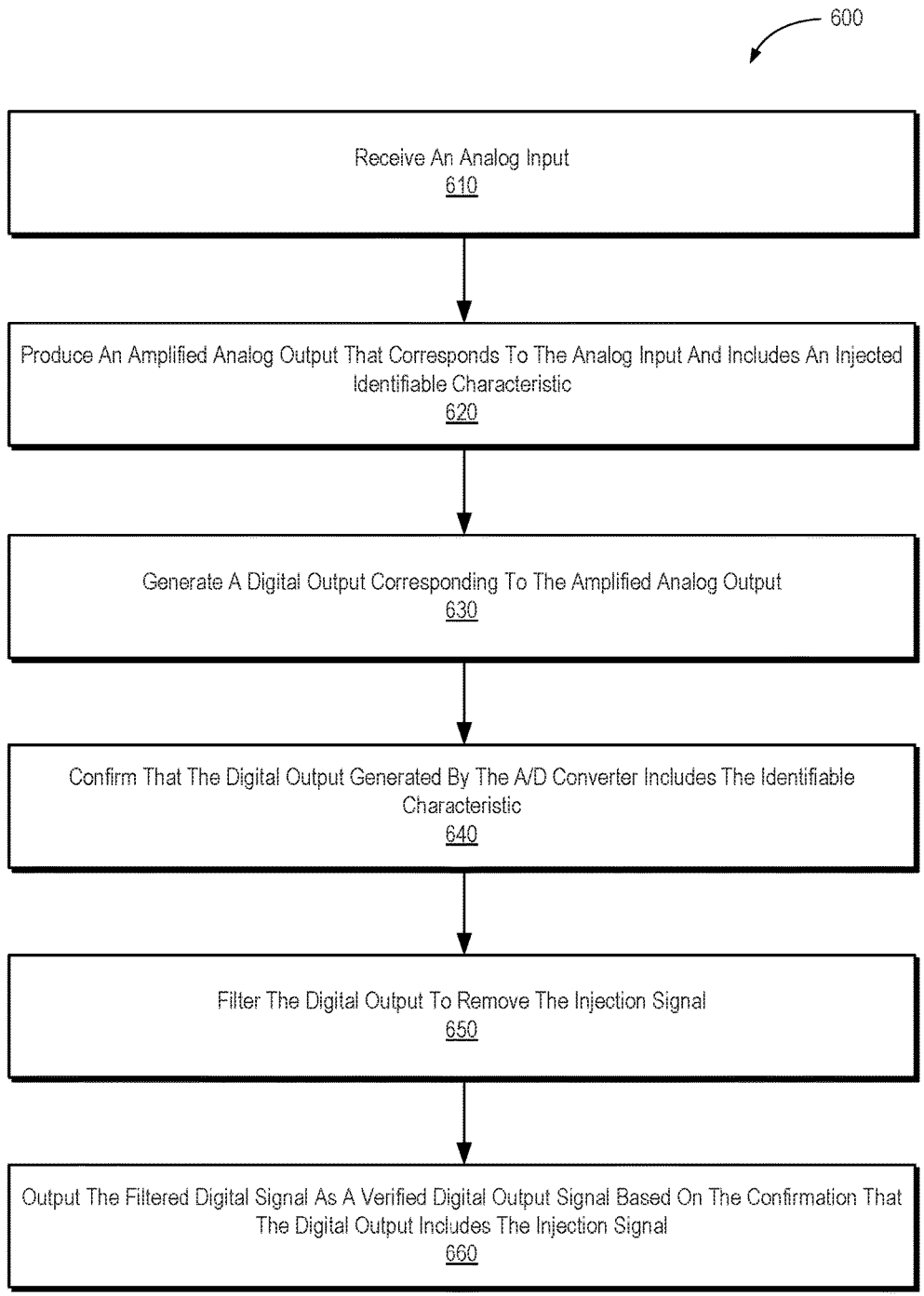
FIG. 6 is a flowchart of a method for verifying an output of an analog to digital converter, according to one embodiment.

FIG. 6 illustrates a flow chart of a method 600 for verifying a digital output of an A/D converter. An amplifier may receive an analog input, at 610. The amplifier may produce an amplified analog output that corresponds to the analog input, at 620. The analog output may include an injected identifiable characteristic. In various embodiments, the injected identifiable characteristic may be associated with an inherent characteristic of the type of amplifier used, or may be injected using a separate circuit. For example, the injected identifiable characteristic may be associated with a chopping frequency of a chopper amplifier and/or any type of amplifier that is chopper stabilized.

An A/D converter may generate a digital output corresponding to the amplified analog output, at 630. A verification module, potentially part of an IED, may confirm that the digital output generated by the A/D converter includes the identifiable characteristic, at 640. In some embodiments, the output may be filtered regardless of the confirmation; in other embodiments, the output may only be filtered if the confirmation is successful. The filtering may be done in analog or digital. At 650, a filter may be used to filter the digital output to remove the injection signal. The filtered digital signal may be output, at 660, as a verified digital output signal based on the confirmation that the digital output includes the injection signal.

Figure 7:
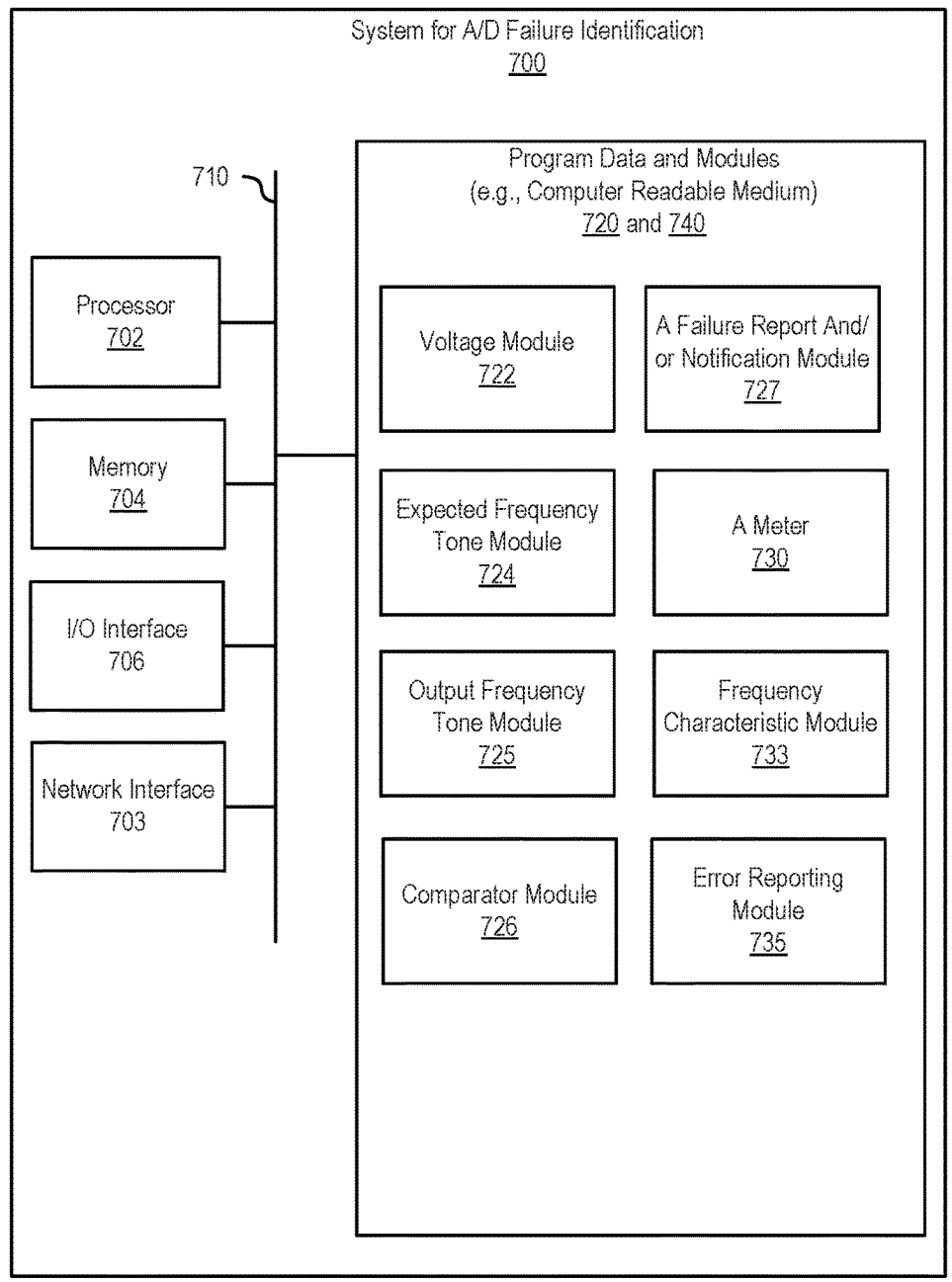
FIG. 7 is a system for identifying a failure of an analog to digital converter, according to one embodiment.

FIG. 7 is a system for identifying failures of an A/D converter, according to one embodiment. A system for identifying failures of an A/D converter 700 may include a system bus 710, one or more processors 702, a memory 704, an input/output interface 706, and a network interface 703. The memory 704 may be in electrical communication with the one or more processors 702, via a system bus 710, to store program data 740.

The one or more processors 702 may include one or more general purpose devices, such as an Intel®, AMD®, or other standard microprocessor. The one or more processors 702 may include a special purpose processing device, such as ASIC, SoC, SiP, FPGA, PAL, PLA, FPLA, PLD, or other customized or programmable device. The one or more processors 702 may perform distributed (e.g., parallel) processing to execute or otherwise implement functionalities of the present embodiments. The one or more processors 702 may run a standard operating system and perform standard operating system functions. It is recognized that any standard operating system may be used, such as, for example, Microsoft® Windows®, Apple® MacOS®, Disk Operating System (DOS), UNIX, IRJX, Solaris, SunOS, FreeBSD, Linux®, QNX®, ffiM® OS/2® operating systems, and so forth.

The memory 704 may include static RAM, dynamic RAM, flash memory, one or more flip-flops, ROM, CD-ROM, DVD, disk, tape, magnetic, optical, or other computer storage medium. The system bus 710 may facilitate communication and/or interaction between the other components of the system, including the one or more processors 702, the memory 704, the input/output interface 706, and the network interface 703.

Program modules 720 may include all or portions of other elements of the system 700. The modules 720 may run multiple operations concurrently or in parallel by or on the one or more processors 702. Portions of the disclosed modules, components, and/or facilities are embodied as executable instructions embodied in hardware or firmware, or stored on a non-transitory, machine-readable storage medium. The instructions may comprise computer program code that, when executed by a processor and/or computing device, cause a computing system to implement certain processing steps, procedures, and/or operations, as disclosed herein. The modules, components, and/or facilities disclosed herein may be implemented and/or embodied as a driver, a library, an interface, an API, FPGA configuration data, firmware (e.g., stored on an EEPROM), and/or the like. Portions of the modules, components, and/or facilities disclosed herein are embodied as machine components, such as general and/or application-specific devices, including, but not limited to: circuits, integrated circuits, processing components, interface components, hardware controller(s), storage controller(s), programmable hardware, FPGAs, ASICs, and/or the like. Accordingly, the modules disclosed herein may be referred to as controllers, layers, services, engines, facilities, drivers, circuits, and/or the like.

The system memory 704 may also include program data 740. Data generated by the system 700, such as by the modules 720, may be stored on the system memory 704, for example, as stored program data 740. The stored program data 740 may be organized as one or more databases.

The input/output interface 706 may facilitate interfacing with one or more input devices and/or one or more output devices. The input device(s) may include a keyboard, mouse, touch screen, light pen, tablet, microphone, sensor, or other hardware with accompanying firmware and/or software. The output device(s) may include a monitor or other display, printer, speech or text synthesizer, switch, signal line, or other hardware with accompanying firmware and/or software.

The network interface 703 of the system 700 may be configured to communicate over a communication network with one or more computing devices. Program and/or module data 720, 740 may be received via the network interface 703 over a network from an appropriate device, such as a computing device, an IED, or even a mobile computing device. The program data 740 may be received as user input manually entered into a user interface of an appropriate IED or computing device. The program data 740 may also be received from one or more A/D converters through the network interface 703, or through the input/output interface 706. The program data 740 may be received automatically from a data management system on an IED or a computing device.

As noted, the system 700 also includes various modules 720 (or engines, elements, or components) to implement functionalities of the system 700, including a voltage module 722, an expected frequency tone module 724, an output frequency tone module 725, a comparator module 726, and/or a failure report and/or notification module 727. These elements may be embodied, for example, at least partially in the program modules 720. In other embodiments, these elements may be embodied or otherwise implemented in hardware of the system 700. The system 700 may also include program data 740 such as one or more voltage values, one or more of a first magnitude and/or a first frequency of a single frequency tone, one or more second magnitudes of a single frequency tone, one or more comparison outcomes, and/or one or more failure reports that may be stored in the memory 704, which may be generated, accessed, and/or manipulated by the modules 720.

The voltage module 722 may be configured to determine a plurality of consecutive voltage values associated with an output of an A/D converter. The voltage module 722 may be configured to store a plurality of consecutive voltage values in the program data 740. Each of the voltage values of the voltage module 722 may be based on an analog voltage input to the A/D converter, and each of the voltage values may include the time at which the voltage value was determined. The voltage module 722 may be configured to determine a plurality of consecutive voltage values associated with an analog voltage of an output of an A/D converter that may couple with the system 700 via the network interface 703. In other embodiments, the voltage module 722 may determine the plurality of voltage values associated with an analog voltage of an input of an A/D converter that may couple with the system 700 via the input/output interface 706. The system 700 may be further configured to store a time at which each of the voltage values may have been determined by the voltage module 722.

The expected frequency tone module 724 may be configured to determine a first magnitude and a first frequency of a single frequency tone associated with an output of an A/D converter. A first magnitude and/or a first frequency may be associated with an amplifier module, and/or the output of an amplifier module, of the A/D converter.

The output frequency tone module 725 may be configured to determine one or more second magnitudes of a single frequency tone of the output of each A/D converter. The second magnitude of a single frequency tone of an A/D converter may be determined according to any suitable method. For example, a fast Fourier transform operation may be performed on the plurality of consecutive voltage values with a corresponding frequency domain analysis of the resulting values.

The comparator module 726 may compare the determined second magnitude and the first magnitude of the first and second A/D converters. The comparator module 726 may identify a failure of the first and/or second A/D converters, if the determined second magnitudes of the single frequency tones from the first and second A/D converters are less than or greater than one or more identified first magnitudes. The determined second magnitudes may be greater than the first magnitudes of either the first or the second A/D converter. The comparator module 726 may be configured to identify a non-failure, or may indicate that no failure of an A/D converter has been identified.

Based on an output of the comparator module 726, the failure report and/or notification module 727 may report a failure of an A/D converter. If a determined second magnitude is less than a first magnitude, the failure report module may be configured to report a failure of an A/D converter. For example, the comparator module 726 may determine that a determined second magnitude is less than a first magnitude configured to be a minimum magnitude of the single frequency tone of the output of an A/D converter. The comparator module 726 may identify a failure of the A/D converter, and the failure report module 727 may report the failure according to any suitable method.

For example, the failure report module may be configured to report a failure of the A/D converter to a communication system coupled with the system 700. The system 700 may be configured to illuminate one or more warning lights, and may indicate a failure of an A/D converter with the one or more illuminated warning lights. The system 700 may be configured to alter one or more processes, and/or configure one or more components of a power system coupled with the system 700. However, the system 700 may be configured to operate according to any suitable manner in response to one or more identified failures of an A/D converter. The failure report module 727 may be configured to communicate a status of one or more A/D converters to a communication system coupled with the system 700. The system 700 may include one or more status lights to indicate when no failures have been detected in one or A/D converters configured to couple with the system 700.

A meter module 730 may be configured to identify a frequency characteristic injected by an amplifier into an input of an A/D converter. The input to the amplifier may comprise a frequency $f_a$, and the output of the amplifier may be $f_a+f_c$, where $f_c$ is the injected frequency characteristic.

The meter module 730 may also obtain a measurement of an output of the A/D converter. A frequency characteristic module 733 may determine that the frequency characteristic, $f_c$, is missing from the output of the A/D converter. Additionally, the frequency characteristic module 733 may determine that the frequency characteristic, $f_c$, has changed frequency or magnitude in a manner indicative of an A/D and/or amplifier failure. An error reporting module 735 may report a failure of the A/D converter based on the determination that the frequency characteristic, $f_c$, is missing or otherwise different from the expected frequency characteristic as determined by the expected frequency tone module 724.

This disclosure has been made with reference to various embodiments, including the best mode. However, those skilled in the art will recognize that changes and modifications may be made to the embodiments without departing from the scope of the present disclosure. While the principles of this disclosure have been shown in various embodiments, many modifications of structure, arrangements, proportions, elements, materials, and components may be adapted for a specific environment and/or operating requirements without departing from the principles and scope of this disclosure. These and other changes or modifications are intended to be included within the scope of the present disclosure.

This disclosure is to be regarded in an illustrative rather than a restrictive sense, and all such modifications are intended to be included within the scope thereof. Likewise, benefits, other advantages, and solutions to problems have been described above with regard to various embodiments. However, benefits, advantages, solutions to problems, and any element(s) that may cause any benefit, advantage, or solution to occur or become more pronounced are not to be construed as a critical, required, or essential feature or element.

What is claimed:

1. An analog to digital (A/D) conversion system with failure identification, comprising:
   an amplifier configured to receive an input and produce an amplified output injected with at least one identifiable characteristic;
   an A/D converter configured to receive the amplified output and convert the output to a digital output;
   a failure identification module configured to determine the existence, non-existence, or variation of the identifiable characteristic in the digital output;
   a filter configured to filter the digital output to remove the identifiable characteristic from the digital output; and
   an alert module configured to provide a failure notification based on a determination by the failure identification module that the identifiable characteristic does not exist in the digital output, or has changed in a manner indicative of an A/D failure and/or amplifier failure.

2. The A/D conversion system of claim 1, wherein the amplifier is chopper stabilized.

3. The A/D conversion system of claim 1, wherein the amplifier comprises a chopper amplifier.

4. The A/D conversion system of claim 3, wherein the frequency characteristic associated with the amplifier comprises a chopping frequency of the chopper amplifier.

5. The A/D conversion system of claim 1, wherein the failure identification module is configured to determine that the frequency characteristic is missing or exhibits significant variation based on a frequency domain analysis of a fast Fourier transform of the output of the A/D converter.

6. The A/D conversion system of claim 1, wherein the frequency characteristic associated with the amplifier comprises at least one injected frequency tone.

7. An intelligent electronic device (IED) configured to identify a failure in an analog to digital (A/D) converter, comprising:
  a meter configured to:
    identify a frequency characteristic injected by an amplifier into an input of an A/D converter, wherein the input to the amplifier comprises a frequency $f_a$, and the output of the amplifier comprises $f_a+f_c$, where $f_c$ is the injected frequency characteristic; and
    obtain a measurement of an output of the A/D converter;
  a frequency characteristic module configured to determine that the frequency characteristic, $f_c$, is missing or exhibits significant variation from the output of the A/D converter; and
  an error reporting module configured to report a failure of the A/D converter based on the determination that the frequency characteristic, $f_c$, is missing or exhibits significant variation from the output of the A/D converter.

8. The IED of claim 7, wherein the frequency characteristic identified by the meter corresponds to a chopping frequency of a chopper-stabilized amplifier.

9. The IED of claim 7, wherein the meter is configured to identify the frequency characteristic by accessing a stored value corresponding to a known chopping frequency of a chopper amplifier.

10. The IED of claim 7, wherein the meter is configured to identify the frequency characteristic by measuring a chopping frequency of a chopper amplifier.

11. The IED of claim 10, wherein the meter is configured to measure the chopping frequency of a chopper amplifier by comparing an input and an output of the chopper amplifier.

12. The IED of claim 7, wherein the frequency characteristic module is configured to determine that the frequency characteristic is missing or exhibits significant variation based on a frequency domain analysis of a fast Fourier transform of the output of the A/D converter.

13. The IED of claim 7 wherein the frequency characteristic associated with the amplifier comprises at least one injected frequency tone.

14. A method for verifying a digital output of an analog to digital (A/D) converter, comprising:
  receiving, by an amplifier, an analog input;
  producing, by the amplifier, an amplified analog output that corresponds to the analog input and includes an injected identifiable characteristic;
  generating, via an A/D converter, a digital output corresponding to the amplified analog output;
  confirming, via a verification module, that the digital output generated by the A/D converter includes the identifiable characteristic;
  filtering the digital output to remove the injection signal; and
  outputting the filtered digital signal as a verified digital output signal based on the confirmation that the digital output includes the injection signal.

15. The method of claim 14, wherein the gain of the amplifier is greater than, less than, or equal to unity.

16. The method of claim 14, wherein the amplified analog output is inherently injected with the identifiable characteristic based on the type of amplifier used.

17. The method of claim 14, wherein the amplified analog output is injected with the identifiable characteristic via a separate injection circuit.

18. The method of claim 14, wherein the amplifier comprises a chopper amplifier and wherein the injected identifiable characteristic comprises a chopping frequency inherently injected by the chopper amplifier.

19. The method of claim 14, wherein confirming that the digital output generated by the A/D converter includes the identifiable characteristic comprises the use of a frequency domain analysis using a fast Fourier transform.

20. The method of claim 14, wherein the verification module is part of an intelligent electronic device configured to monitor the A/D converter, and
  wherein a failure to confirm that the digital output generated by the A/D converter includes the identifiable characteristic results in the further method step of:
  reporting a failure of the A/D converter.

* * * * *